United States Patent [19]

Lindstrom et al.

[11] E Re. 29,420

[45] Reissued Sept. 27, 1977

[54] SINTERED CEMENTED CARBIDE BODY COATED WITH TWO LAYERS

[75] Inventors: Jan Nils Lindström, Hagersten; Bo Folke Jonsson, Huddinge; Fall Johan Olof William Ohlsson, Enskede, all of Sweden

[73] Assignee: Sandvik Aktiebolag, Sandviken, Sweden

[21] Appl. No.: 562,013

[22] Filed: Mar. 26, 1975

Related U.S. Patent Documents

Reissue of:

[64] Patent No.: 3,837,896
Issued: Sept. 24, 1974
Appl. No.: 303,362
Filed: Nov. 3, 1972

[30] Foreign Application Priority Data

Nov. 12, 1971 Sweden ..... 14479/71

[51] Int. Cl.[2] ..... C23C 11/14; C23C 13/02; C23D 5/00

[52] U.S. Cl. ..... 428/336; 30/346.53; 30/346.54; 148/20.3; 148/31.5; 148/126; 428/432; 428/545

[58] Field of Search ..... 428/336, 432; 30/346.53, 346.54; 29/195 A, 195 M, 195 T; 148/126, 20.3, 31.5

[56] References Cited

U.S. PATENT DOCUMENTS

| | | | |
|---|---|---|---|
| 2,872,350 | 2/1959 | Homer et al. | 117/106 C |
| 2,994,124 | 8/1961 | Denny et al. | 29/195 M |
| 3,249,460 | 5/1966 | Gerry | 428/408 |
| 3,260,579 | 7/1966 | Scales | 29/195 A |
| 3,313,605 | 4/1967 | Gill | 29/195 A |
| 3,393,084 | 7/1968 | Hartwig | 427/249 |
| 3,475,161 | 10/1969 | Ramirez | 427/372 |
| 3,640,689 | 2/1972 | Glaski et al. | 29/195 |
| 3,719,519 | 3/1973 | Perugini | 117/69 |
| 3,721,577 | 3/1973 | Woerner | 427/249 |

*Primary Examiner*—Thomas J. Herbert, Jr.
*Attorney, Agent, or Firm*—Pierce, Scheffler & Parker

[57] ABSTRACT

A sintered hard metal body (e.g., a cutting insert) is provided as to wear resistance by depositing thereon an intermediate thin coating of a metallic carbide or metallic nitride free from binder metal and applying over this intermediate coating a thin ceramic coating free from binder metal.

4 Claims, 2 Drawing Figures

Figure 1:
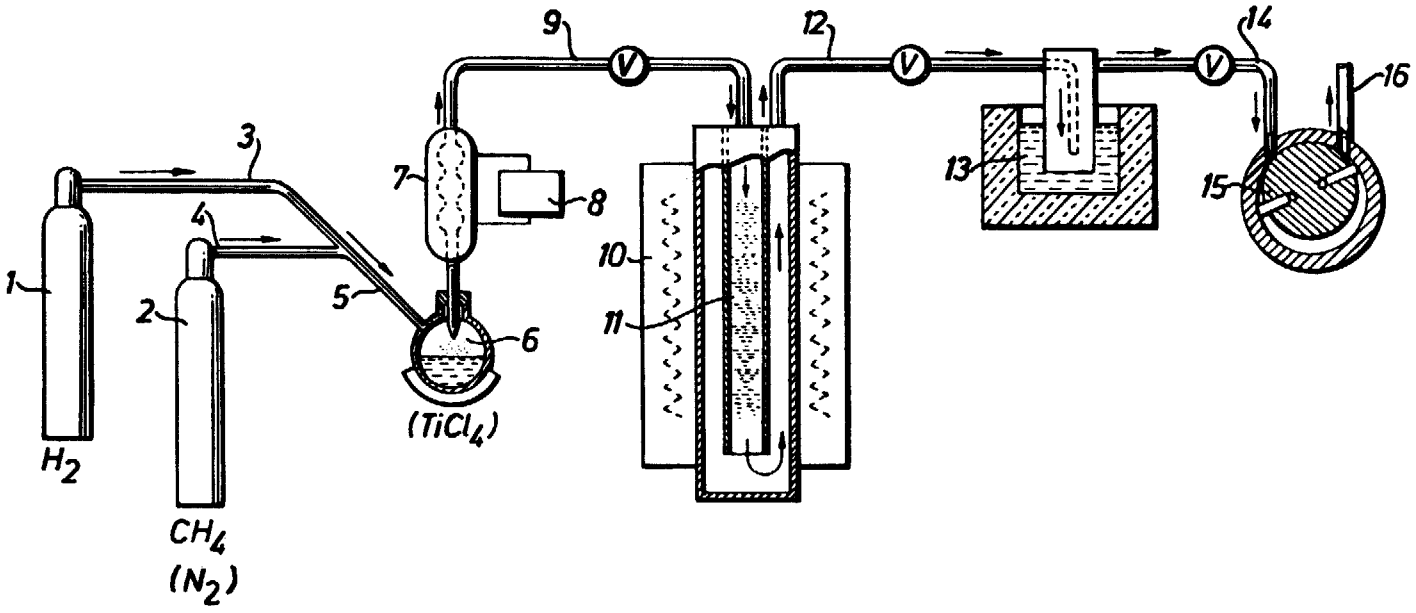

1
2
3
4
5
6
7
8
9
10
11
12
13
14
15
16
$H_2$
$CH_4$
$(N_2)$
$(TiCl_4)$

SINTERED CEMENTED CARBIDE BODY COATED WITH TWO LAYERS

Matter enclosed in heavy brackets [ ] appears in the original patent but forms no part of this reissue specification; matter printed in italics indicates the additions made by reissue.

The present invention relates to sintered hard metal bodies coated with thin, extremely wear-resistant surface layers.

It heretofore was known that considerable improvements of properties can be obtained in hard metal bodies, — as for example cutting inserts, — by applying a surface layer, having increased wear resistance, upon a substrate of normal sintered hard metal containing at least one carbide together with binder metal. Usually, a very thin layer of a metallic carbide, such as titanium carbide, has been applied to the hard metal substrate or insert by deposition from a gaseous phase.

It was also known that further advantage could in certain cases be obtained by using a thin surface layer composed of two different carbide layers applied one above the other. Furthermore, it had been proposed to have a diffusion barrier layer between the hard metal substratum and the carbide surface layer. In a special case there has been mentioned the use of a nitride as barrier material, in which the barrier carbon has low rate of diffusion.

In this field it also had been found possible to coat hard metal, e.g., cutting inserts, with wear-resistant, extremely thin, ceramic layers which, in certain cases, have caused improved wear resistance, and in the case of cutting inserts particularly good cutting results and increased tool life were noted. The ceramic surface layer has principally consisted of $Al_2O_3$ and/or $ZrO_2$. The product may be regarded as a combination in which the known great wear resistance of ceramic inserts as well as the relatively good toughness of cemented carbide have been exploited. The coating layer has been produced by deposition from a gaseous phase. This method has meant extremely uniform and thin layers which has not been reached in earlier-used methods, as for instance enameling of hard metal. However the hard metal, coated with ceramic layers, has hitherto only to a limited extent reached the potential improvements of the properties, which solitary favorable tests have shown. The reason has been an unsatisfactory bond or adherence between substratum and ceramic layer, and also unfavorably large grain-size and porosity in the very layer.

A radical solution of the problem of obtaining optimum and reproducible results or properties of the hard metal body coated with ceramic layer has now been found possible by coating the substratum with one or more layers of a metallic carbide and/or nitride and then applying the ceramic layer thereover. It is already known, as earlier has been mentioned, to apply coatings of carbides and/or nitrides to hard metal bodies, applying single layers as well as "sandwich" layers. It must, however, be considered very unexpected that the use of the mentioned coatings as an intermediate layer below a pure ceramic surface layer would be favorable and give essential improvements of properties. The expected drawback should be the essential differences between a pure ceramic material as [$al_2O_3$] $Al_2O_3$ or $ZrO_2$ and carbides and/or nitrides of metallic nature. There are, however, several explanations in this case to the favorable results, which will be discussed in the following.

According to the invention the coated hard metal body is thus characterized in that the thin surface coating consists of two successive layers containing no binder material. The outer layer consists of one or more extremely wear-resistant layers of aluminum oxide and/or zirconium oxide, while the intermediate layer, situated next to the cutting body, consists of one or more layers of one or more carbides and/or nitrides of titanium, zirconium, hafnium, vanadium, niobium, tantalum, chromium, molybdenum, tungsten, silicon and/or boron, i.e. except silicon and boron, metals in the 4th -6th subgroups of the periodic system.

It is possible to vary the thickness of the above-described intermediate layer, and also of the surface layer, in certain limits whilst still maintaining the favorable properties. Thus, thinner carbide or nitride layers may be used than in known merely carbide-coated hard metal inserts, in which have been found optimum properties for example at 4 $\mu$m thick TiC layers. In order to obtain completely tight and functioning carbide and/or nitride layers, suitable according to the invention, the thickness shall be at the least 0.5 $\mu$m. Optimum results have been found when the thickness of the inner layer has been 1-10 $\mu$m and preferably 2-6 $\mu$m. The thickness of the outer, ceramic, layer should be 0.2-20 $\mu$m, preferably 0.5-5 $\mu$m. We have thus found that even very thin oxide layers, applied upon barrier layers of nitride and/or oxide, cause a considerable improvement in the wear resistance, at maintained toughness.

One explanation of the improved result obtained in hard metal bodies according to the invention seems to be that the intermediate layer impedes diffusion of binder metal, i.e., mainly Co, from the hard metal substratum into the formed oxide layer. Also carbon diffusion is considerably retarded.

In applying oxide, e.g., $Al_2O_3$ or $ZrO_2$ layers, by deposition from gaseous phase, i.e. by means of "CVD" or "Chemical Vapor Deposition," which is the normal way for hard metal bodies according to the invention, the binder metal, e.g., Co, seems to have a considerable influence on the rate of the coating operation on the formation of whiskers and the adherence of the layer to the substrate. The binder metal has probably an accelerating effect on the growth of the oxide layer, which will preferably be nucleated on the binder phase surfaces of the hard metal. Carbon also causes a similar behavior.

It has now been found possible by means of the invention to control the formation of the oxide layer in view of the influence of the substratum.

For optimum properties of the coated body it is necessary that the coating be uniform and fine grained, and also that the layer have good adherence. To obtain these requirements, the speed of the coating process must be slow, which now has been made possible according to the invention by impeding the influence of the binder metal and carbon, i.e., eliminating their accelerating effect on the growth of the layer. Too high rate of formation of the layer means large grains and whiskers, which give porous layers and bad adherence. Furthermore, the surface of the substratum must be well-defined, uniform and homogeneous, so that the growth of the layer can be initiated at as many close points on the surface as possible. From the following it is realized that the surface of the hard metal substratum does not fulfill this demand. The adherence is thus acceptable only between the layer and the binder metal grains of the substratum, while it is less good between the layer and the carbide grains of the substratum. However, by first applying a uniform, homogeneous and extremely fine-grained layer of carbide and/or nitride upon the substratum, good pre-requisite conditions have been set up for the mentioned initiating of the ceramic layer, the process being run at a not too fast rate upon certain parts of the surface but uniformly upon the whole surface.

Binder metals, e.g., Co, may also diffuse through the formed oxide layer at the temperature of the deposition. By means of the invention the risks of such troublesome influence have been decreased. The diffusion rate of Co is thus very low in a layer of carbide and/or nitride.

Another advantage of using an intermediate layer according to the invention is a favorable gradual transition between the extremely wear-resistant surface layer and the relatively tough substratum. Carbide- or nitride layers, as of TiC or TiN, have namely toughness and wear-resistance properties placing them between aluminum oxide (ceramic cutting inserts) and cemented carbide.

In depositing $Al_2O_3$ according to the "CVD-process," there are in the used gas generally $AlCl_3$ ($AlBr_3$ or $AlF_3$) and $CO_2$ or $H_2O$.

The intermediate layer prevents carburization of the hard metal substratum, which would lead to bad toughness. In this case, the intermediate layer of carbide and/or nitride has a favorable influence as a barrier to carbon diffusion from the stratum.

The binder metal phase of cemented carbides is always surface oxidized in air, and becomes it soon in the atmosphere of depositing oxide layers, even if the hard metal surface has been pre-reduced. Therefore, it is expected that this oxide (II state) would form stable spinel bindings with $Al_2O_3$ (III state). Also bonds between IV-state oxides as $ZrO_2$ and II-stage oxides as CoO are usually strong. It is therefore surprising that a stronger bond is obtained between for example TiC on the one hand and $Al_2O_3$ or respectively $ZrO_2$ on the other hand. The effect is probably connected with the slower deposition rate in the presence of the TiC layer.

Accordingly, it is of great practical and economic value to decrease the rate of deposition according to the invention. Other methods of decreasing the deposition rate, — for instance via process variables, — have considerable drawbacks. For example, a decrease of the temperature causes a weakened metallurgical bond because of decreased substitution diffusion. A decrease of the reactant flow increases the risk that the farthest parts of the charge, seen from the gas inlet, have insufficient gas supply.

In carrying out the principles of the invention it is possible to oxidize (or nitrate) the hard metal surface as a pretreating process before the carbide- or nitride coating. Furthermore, the bond between TiC—(TIN)—and oxide layer can be improved by surface oxidizing of the TiC (TiN) layer after the deposition.

Either of two different principal methods may be used for treating hard metal:

1. The coating process is done in at least two separate steps and in separate facilities. The first step or partial process consists of forming a barrier layer, i.e., carbide and/or nitride layer, and the second step or partial process consists of possible oxidizing the surface of the barrier and formation of a surface layer of $Al_2O_3$, the oxidation step possibly being done as a separate step in a separate apparatus; or 2. The whole coating process, i.e., the formation of a barrier layer, the possible oxidizing of the surface of the substratum or the barrier and the coating of the barrier with a surface layer of $Al_2O_3$, is done in one and the same operaton by conducting gaseous reagents by turn and gradually adapting the temperature and pressure conditions in the coating reactor.

Alternatively, several oxide layers, as for example first $Al_2O_3$ and then $ZrO_2$, can be applied upon mixed layers on successive layers of carbide and nitride. The barrier layers may also be applied to alternative methods as for example sputtering.

Figure 2:
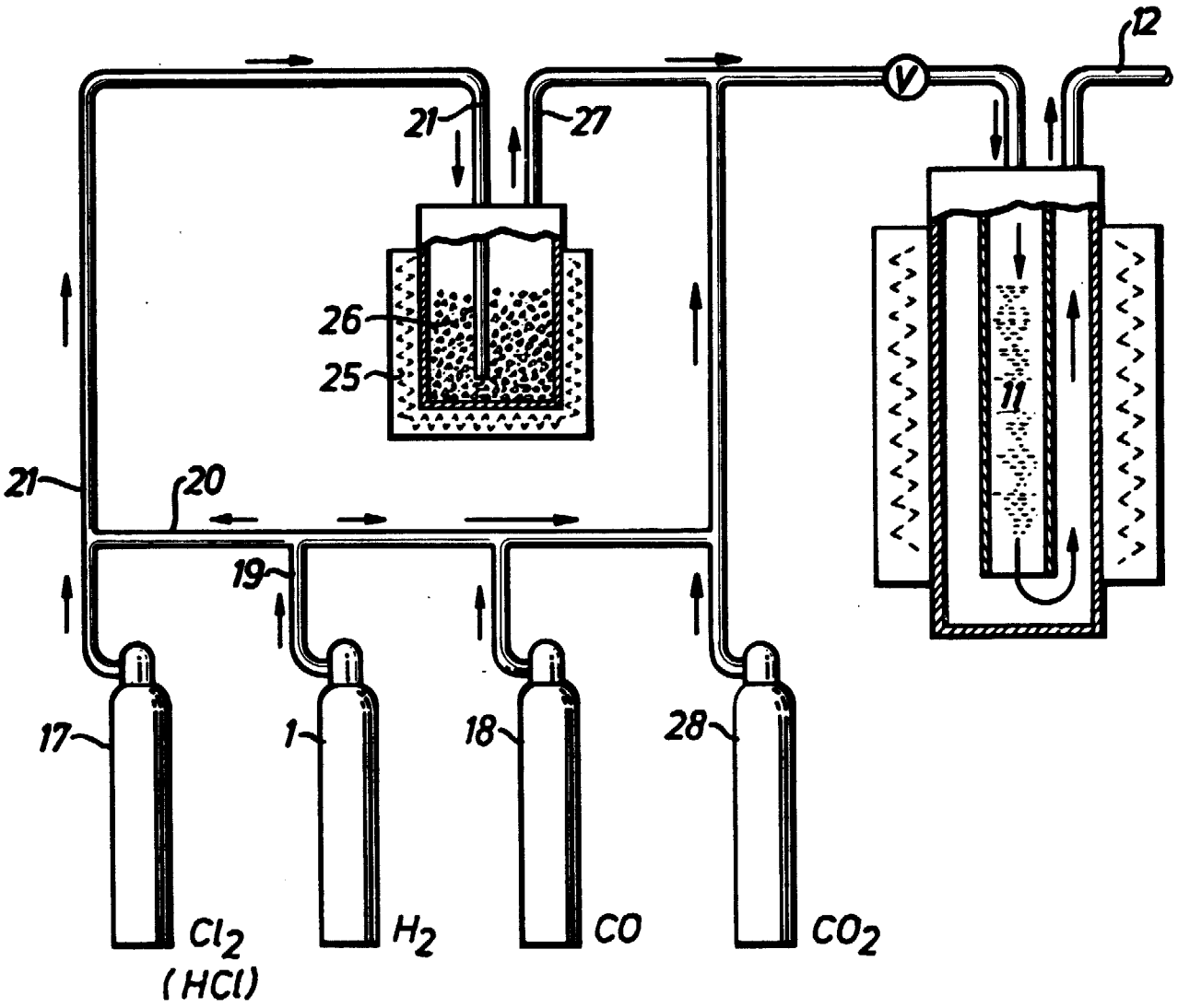

The invention will be further illustrated in the following Examples 1-7 and in the appended drawing in which:

FIG. 1 is a principle sketch of production apparatus useful in carrying out the invention; and FIG. 2 is a principle sketch of alternative detail in the apparatus according to FIG. 1.

The apparatus shown in FIG. 1 consists of gas sources, for example gas tubes 1, 2 for supplying hydrogen respectively methane and/or nitrogen. Conduits 3 and 4 from respective source units unite into a conduit 5, through which the gas mixture is brought to a vessel 6 in which a metal halide, for example $TiCl_4$, is heated to evaporation, after which the composite gas is conducted to a reactor 11 via a joint conduit 9. the gas mixture passes a heat exchanger 7 controlled by a thermostat 8 for adjusting the content of $TiCl_4$ in the gas. In reactor 11, which is heated by a furnace 10, the substratum is placed for coating. From the reactor vessel 11 the gas is sucked out via a valved conduit 12 and a cooling trap 13. Evacuation of gas from the system is effected via a conduit 14 by the help of a vacuum pump 15 having an outlet conduit 16.

The apparatus sketched in FIG. 2 shows the use of a chlorination reactor 25 for chlorination of Al respectively Zr, for example in the form of grains or chips 26. For this purpose hydrogen from a gas source 1 is mixed via conduits 19, 20 with chlorine, alternatively hydrochloric acid gas, from a chlorine gas alternatively hydrochloric acid source 17, and the mixture is brought to chlorination reactor 25 via a conduit 21. The gas mixture from chlorination reactor 25 is then mixed with hydrogen and carbon monoxide (not necessary) and carbon dioxide from gas sources 18 respectively 28. The resulting mixture is brought to coating reactor 11 via valved conduit 27.

(In the drawing purification facilities for gas have been omitted.)

The following seven examples make clear the manufacturing conditions for hard metal bodies according to the invention. The examples deal with coating of cutting inserts. Also wear-parts of hard metal having improved corrosion- and wear-resistance have been manufactured in similar ways.

EXAMPLE 1

Coating with an intermediate layer of TiC was performed in a reactor whose essential parts were made of "Inconel." 3,000 sintered cemented carbide inserts were heated to 1,000° C. in this reaction vessel. The inserts were of a grade containing about 40% WC, 15% Co and 45% (all % by volume) cubic carbides in the form of TiC, TaC and NbC (and possibly ZrC). The inserts were placed on strainer-like plates providing good contact with the surrounding gas. The gas, which consisted of a mixture containing 10% $TiCl_4$, 8% $CH_4$ and 82% $H_2$, manufactured in a normal way, was brought to the reactor in one single conduit. The pressure in the reactor was maintained at 15 torr (mm Hg) by sucking out the gas from the reaction vessel by means of a vacuum pump protected from corrosive reaction products (for instance HCl) by the help of a cooling trap with liquid nitrogen situated ahead of the pump. In this way a linear gas flow rate of 1 m/sec was obtained in the charge.

The treatment went on for 2 hours.

As a result of the treatment, a fine-grained, tight, TiC-layer of about 2 μm thickness was obtained. The amount of embrittling η-phase, because of decarburizing, was very little in consequence of the relatively short time of treatment.

In a separate, second, step the 3,000 inserts were treated in an apparatus nearly identical to the one described, the gas supply system being modified, however, so that a gas with the composition 70% $H_2$, 5% $CO_2$, 20% CO and 5% $AlCl_3$ could be dosed. The temperature of the substratum was 1,100° C. and the pressure 15 torr. A linear gas flow rate of 3 m/sec was used. After a coating time of 8 hours, a 2 μm thick layer of $Al_2O_3$ had been formed on the TiC-coated hard metal inserts. The binding between the $Al_2O_3$ layer and TiC layer was good and no embrittling η-phase had been formed in the boundary layer, cemented carbide-TiC. Some hard metals inserts of the same type and grade but not coated with TiC, had in the same $Al_2O_3$ coating operation been given a 15 μm thick, porous and poorly adhering layer. Embrittling η-phase had been formed between layer and substratum.

EXAMPLE 2

Also barrier layers of TiN have been manufactured in a way analogous to Example 1. The gas composition was changed, however, to 10% $TiCl_4$, 30% $N_2$ and 60% $H_2$. As a result of the treatment a fine-grained, tight, layer of about 3 μm was obtained (essentially TiN but with some amount of TiC because of a slight carbon diffusion from the substratum). The amount of embrittling η-phase because of decarburizing was very small, however.

In a second step the 3,000 inserts were treated in an apparatus identical to the pre-treating equipment, the gas supply system being modified, however, so that a gas composed of 70% $H_2$, 5% $CO_2$, 20% CO and 5% $ZrCl_4$ could be dosed at 1,000° C. The pressure was 15 torr and the linear gas flow rate 5 m/sec.

After a treating time of 5 hours, a 5 μm thick $ZrO_2$ layer with good adherence to the TiN layer was obtained. Upon inserts of the same grade, but not treated with TiN, a too thick (30 μm), coarse-grained porous layer having poor adherence was obtained at the same time. Embrittling η-phase was formed in the boundary zone between layer and substratum.

EXAMPLE 3

Having the same process conditions as in Example 1, the whole coating was done in one apparatus without intermediate cooling of the inserts. Double gas supply systems were used, one for $TiCl_4$ (connected during the first period of the coating) and the other for $AlCl_3$. Between the two coating periods there was used only one vacuum pumping with a view to change gas atmosphere. (A gradual transition, i.e., an intermediate simultaneous deposition is also possible. The simultaneous deposition may possibly go on all the second coating period. Also titanium oxide, possibly dissolved in TiC, will then be obtained in the $Al_2O_3$ layer). The result corresponded to the result of Example 1.

EXAMPLE 4

The process was performed in accordance with Example 3 with the exception that an oxidation step was interposed between the two periods. After a first vacuum pumping in order to remove $TiCl_4$ and $CH_4$, an oxidizing gas was introduced, for example hydrogen saturated with water vapor at 30° C. After renewed vacuum pumping the aluminum oxide was deposited.

EXAMPLE 5

The deposition process for $Al_2O_3$ was done as in Example 1 but upon hard metal inserts coated with a 2 μm thick layer of TiC on one or more faces by means of sputtering.

In the following Example 6 there are results from cutting tests, in which cutting inserts according to the invention have been compared with earlier known inserts.

EXAMPLE 6

The cutting test was done in the form of turning on a workpiece of a carbon steel having a C content of 1% and a hardness of about HB 300, under the following cutting conditions:

| | | |
|---|---|---|
| Cutting Speed | : | 160 m/min |
| Feed | : | 0.30 mm/rev. |

The tool life, measured according to current norms, was estimated for the following hard metal grades:

| Grade, corresponding to | | | Life of insert, min. |
|---|---|---|---|
| 1. ISO P30 | (standard) | | 3.3 |
| 2. ISO P30 | TiC layer, | 4 μm | 15.5 |
| 3. ISO P30 | with $Al_2O_3$ layer, | 4 μm | 18.3 |
| 4. ISO P30 | with $Al_2O_3$ layer, | 15 μm | 4.3 |
| 5. ISO P30 | with TiC layer, | 2 μm | |
| | + $Al_2O_3$ layer, | 2 μm | 43.4 |

The hard metal grade according to ISO P30 had the composition (in % by weight): 9.5% Co, 12% TiC, 6% TaC, 4% NbC and the balance being WC.

The results show that coating with a thin TiC layer (No. 2) gave, as expected, an improvement of the life of the cutting insert in relation to the standard insert (No. 1). A thin layer of $Al_2O_3$ (No. 3) caused also an improvement in relation to the standard insert. A thick layer of $Al_2O_3$ (No. 4), which hitherto has been generally obtained, gave on the other hand only a small improvement. A double layer according to the invention, with thin layers of TiC as well as $Al_2O_3$ (No. 5) gave, however, a particularly great increase of the life of the insert.

EXAMPLE 7

Coating of 3,000 sintered hard metal cutting inserts was performed in a similar manner as described in Example 1 except some differences mentioned in the following. Thus, the hard metal grade consisted of 75% WC, 9.5% Co and 15.5% (all % by volume) cubic carbides in the form of TiC, TaC and NbC. The first treatment, involving coating with a barrier layer of TiC, went on for 8 hours and resulted in a layer of about 5 μm thickness. In the separate, second step involving use of the same $AlCl_3$-containing gas mixture as that identified in the second step of Example 1, the pressure was 10 torr and a linear gas flow rate of 4 m/sec was used. After a coating time of 5 hours, a well adherent layer of $Al_2O_3$ with a thickness of 0.8 μm had been formed.

Some hard metal inserts of the same type and grade, but not coated with TiC, had in the same $Al_2O_3$ coating operation been given a 30 μm thick, porous and poorly adhering layer.

Cutting tests were performed with the mentioned inserts. In turning a shaft composed of a chromium alloyed steel with a hardness of about HB 280, using a cutting speed of 160 m/min and a feed of 0.30 mm/rev., the following tool life was estimated (the grade was meant for ISO P25).

| | | Life min. |
|---|---|---|
| 1. Substratum | and 5 μm TiC surface layer | 14.4 |
| 2. Substratum | and 5 μm TiC intermediate layer + 0.8 μm $Al_2O_3$ surface layer | 63.5 |

The criterium of "worn out" was a rejected surface finish of the workpiece as a result of wear or pitting of the cutting edge.

In cutting tests using 20 operations demanding high toughness, the merely $Al_2O_3$-coated inserts were superior in 11 operations, while the merely TiC-coated inserts were superior in nine operations. The criterium was insert fracture.

We claim:

1. Compound body consisting of a core or substratum of sintered cemented carbide containing a small quantity of a binder metal, on which core or substratum is a very thin and extremely uniform surface coating with higher wear resistance than that of the core or substratum, in which said thin coating consists of two layers applied one above the other by chemical vapor deposition, neither of the layers containing binder metal, the outer layer having a thickness of 0.2–20 μm and consisting of at least one extremely wear resistant deposit consisting essentially of ceramic material selected from the group consisting of aluminum oxide and zirconium oxide and the inner layer lying next to the core or substratum having a thickness of 1–10 μm and consisting of at least one coat of at least one member selected from the group consisting of the carbides and nitrides of Ti, Zr, Hf, V, Nb, Ta, Cr, Mo, W, Si and B.

2. Compound body as defined in claim 1, wherein said core or substratum is formed of WC, cubic carbides and Co and said inner layer is formed of titanium carbide and has a thickness of about 2 μm and said outer layer is formed of $Al_2O_3$ and has a thickness of about 2 μm.

3. Compound body as defined in claim 1, wherein said bore or substratum is formed of WC, cubic carbides and Co and said inner layer is formed of titanium nitride with a minor amount of TiC and has a thickness of about 3 μm and said outer layer is formed of $ZrO_2$ and has a thickness of about 5 μm.

*4. Compound body consisting of a core or substratum of sintered cemented carbide containing a small quantity of a binder metal, on which core or substratum is a very thin and extremely uniform surface coating with higher wear resistance than that of the core or substratum, in which said thin coating consists of two layers applied one above the other by chemical vapor deposition, neither of the two layers containing binder metal, the outer layer having a thickness of 0.2–20 μm and consisting of at least one extremely wear resistant deposit consisting essentially of a member of the group consisting of aluminum oxide, titanium oxide and zirconium oxide, and the inner layer lying next to the core or substratum having a thickness of 1–10 μm and consisting of at least one coat of at least one member selected from the group consisting of the carbides and nitrides of Ti, Zr, Hf, V, Nb, Ta, Cr, Mo, W, Si and B.*

* * * * *